(12) United States Patent
Kato et al.

(10) Patent No.: US 6,635,903 B2
(45) Date of Patent: Oct. 21, 2003

(54) WHITE LIGHT EMISSION DIODE

(75) Inventors: Munehiro Kato, Tokyo-to (JP);
Michihiro Sano, Tokyo-to (JP);
Hiroyuki Sato, Tokyo-to (JP); Kenichi Morikawa, Tokyo-to (JP)

(73) Assignee: Stanley Electric Corporation, Tokyo (JP)

( * ) Notice: Subject to any disclaimer, the term of this patent is extended or adjusted under 35 U.S.C. 154(b) by 0 days.

(21) Appl. No.: 09/898,500

(22) Filed: Jul. 2, 2001

(65) Prior Publication Data

US 2002/0017651 A1 Feb. 14, 2002

(30) Foreign Application Priority Data

Jul. 25, 2000 (JP) ........................................ 2000-223513

(51) Int. Cl.$^7$ ................................................ H01L 33/00
(52) U.S. Cl. ............................ 257/98; 257/81; 257/99; 257/100; 313/499; 313/503
(58) Field of Search ............................ 257/89, 98–100, 257/81; 313/501–3, 499; 372/44, 49

(56) References Cited

U.S. PATENT DOCUMENTS 5,903,017 A * 5/1999 Itaya et al. ................. 257/190
6,229,160 B1 * 5/2001 Krames et al. .............. 257/94
6,340,824 B1 * 1/2002 Komoto et al. ............. 257/99

FOREIGN PATENT DOCUMENTS

JP 410145009 A * 5/1998 ........... H01S/3/225

* cited by examiner

*Primary Examiner*—Nathan J. Flynn
*Assistant Examiner*—Johannes P Mondt
(74) *Attorney, Agent, or Firm*—Hogan & Hartson, LLP (57) ABSTRACT

This invention aims to provide a white light emission diode arranged so that t rays emitted from an exciting element comprising a n-type semiconductor layer and a p-type semiconductor layer are converted by a wavelength converting element to white light which is then irradiated through molded resin. The white light emission diode offers a high color rendering effect desired for liquid crystal back light and minimizes deterioration of the molded resin to improve its light emission life characteristic. The wavelength converting element is provided on one surface of the exciting element and an insulating film is deposited on the other surface with interposition of a p-type ohmic electrode exhibiting a high reflectivity in UV wavelength band. The exciting element has its side surface covered with a n-type ohmic electrode exhibiting a high reflectivity in UV wavelength band.

5 Claims, 6 Drawing Sheets

WHITE LIGHT EMISSION DIODE

BACKGROUND OF THE INVENTION

1. Technical Field of the Invention

This invention relates to a while light emission diode useful as back light for various devices such as illuminator, indicator, and display.

2. Description of the Related Art

Figure 5:
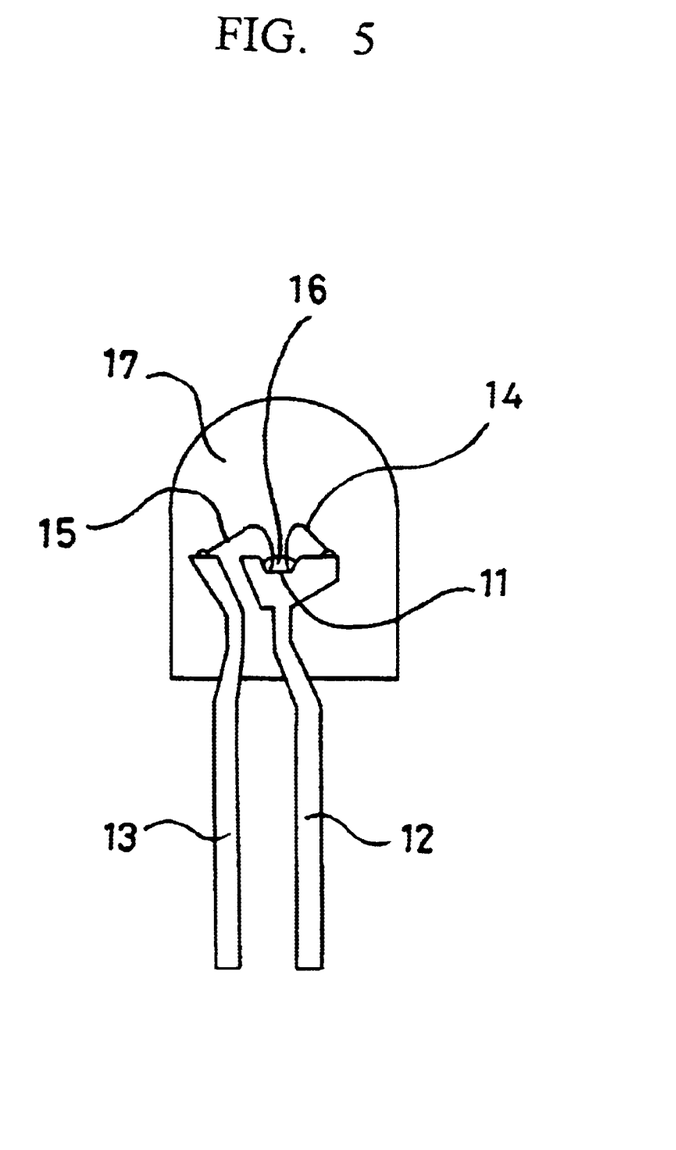
FIG. 5 is a sectional view showing an example of the conventional white light emission diode.

FIG. 5 in the accompanying drawings is a sectional view showing the white light emission diode of prior art which has been practically used.

This emission diode of prior art comprises GaN-based blue excitation element 11 having n-type semiconductor (n-type GaN) and p-type semiconductor (p-type GaN) grown on sapphire substrate and then die-bonded to metal stem 12.

The blue excitation element 11 has its n-type layer electrically connected to the metal stem 12 and its p-type layer electrically connected to a metal stem 13 via gold wire 14, 15, respectively. The blue excitation element 11 is coated with a predetermined thickness of fluorescent material 16.

The blue excitation element 11, the gold wire 14, 15, the fluorescent material 16 and the metal stems 12, 13 are partially surrounded by transparent molded epoxy resin 17 to form the desired white light emission diode.

In the case of the above-mentioned white light emission diode of prior art, the blue excitation element 11 functions as a blue light source emitting blue light which is then wavelength-converted by the fluorescent material 16 to white light.

Figure 6:
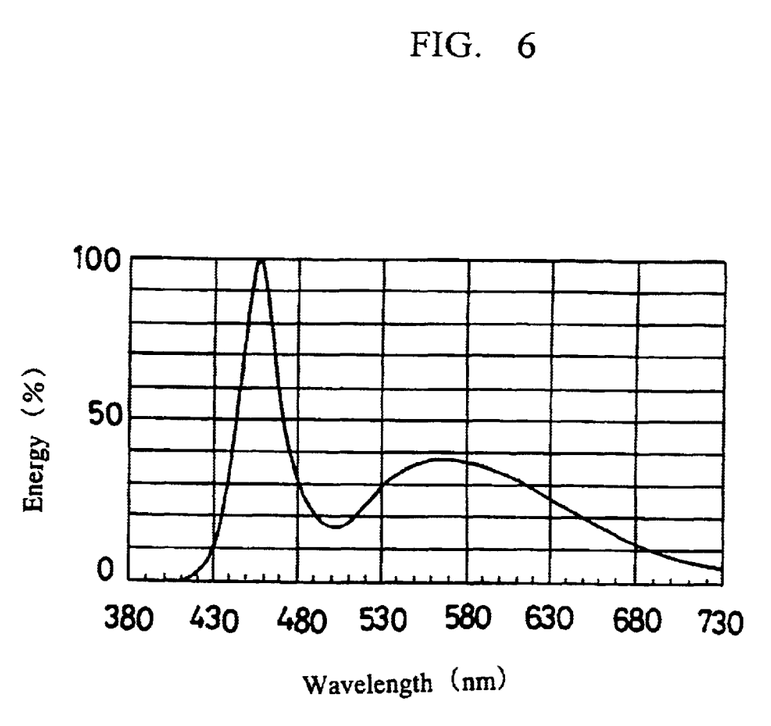
FIG. 6 is a graphic diagram showing a light emission spectrum exhibited by an example of the conventional white light emission diode.

FIG. 6 in the accompanying drawings illustrates emission spectrum presented by said white light emission diode of prior art.

As will be understood from this emission spectrum, white light emitted from said white light emission diode of prior art is a combination of the light (in the vicinity of 450 nm) emitted from the blue excitation element 11 and the light (in the vicinity of 580 nm) emitted from the fluorescent material 16.

In other words, this white light emission diode of prior art is not adapted to generate the desire white light from three primary colors, i.e., blue (having the wavelength of 450 nm), green (having the wavelength of 525 nm) and red (having the wavelength of 660 nm). With a disadvantageous consequence, if it is intended to replace the fluorescent lamp conventionally used as indoor lamp or back light for liquid crystal display by such light emission diode, this replacing emission diode will be accompanied with various problem such as a color rendering.

As one of the measures to solve such problems, a white light emission diode has already been proposed, in which the UV rays emitted from ZnO- or GaN-based UV excitation element is wavelength-converted using fluorescent material to white light.

However, such white light emission diode using the UV exciting element as the light source is disadvantageous in that the molded epoxy resin is deteriorated under the effect of the UV rays emitted from the exciting element and a transmission of the molded resin, therefore, a white light emitting output is correspondingly deteriorated as the time elapses.

In view of the situation as has been described above, it is a principal object of this invention to provide a white light emission diode using the UV exciting element as the excitation light source improved so as to present a high color rendering effect when used as the back light for liquid crystal display and to ensure the effective output of light emission for a relatively long period without any significant deterioration of the molded resin.

SUMMERY OF THE INVENTION

The object set forth above is achieved, according to this invention, by a white light emission diode comprising an exciting element using a p-type semiconductor and a n-type semiconductor to emit UV rays, a wavelength converting element converting said UV rays emitted from said exciting element to white wavelength light rays by means of fluorescent material and transparent molded resin covering these exciting element and wavelength converting element, said white light emission diode being characterized by that said exciting element is provided on its one surface extending in parallel to a region in which said p-type semiconductor and n-type semiconductor are bonded together with a wavelength converting element and further provided on a side surface of said exciting element lying in the vicinity of said region with insulating film being transparent in the UV wavelength band and in the vicinity thereof, and a p-type ohmic electrode and a n-type ohmic electrode both exhibiting a high flexibility in the UV wavelength band and in the vicinity thereof are arranged to cover the surface of said exciting element other than said one surface.

With the white light emission diode, the exciting element functions as a light source emitting UV rays.

The UV rays emitted toward one side of the exciting element are wavelength converted by the wavelength converting element to white light which is then irradiated outward through the molded resin.

The UV rays emitted toward the surface side of the exciting element other than said one side are reflected on the p-type ohmic electrode and the n-ohmic electrode both having a high reflectivity and do not enter the molded resin.

Consequently, the UV rays are converted by the fluorescent material of the wavelength converting element to white light. In this way, the white light emission diode it presents a high color rendering effect.

Deterioration of the molded resin is minimized and the white light emission diode according to this invention can be used for a long period without significant decrease of its light emission output since none of the UV rays enters the molded resin.

The exciting element has its side surface sloped so that one side has a relatively wide dimension and the side opposed thereto has a relatively narrow dimension, resulting in an improvement of the light emission output.

More specifically, the exciting element is provided on its side surface with the ohmic electrodes having a high reflectivity in the V wavelength band and said side surface is sloped so that the UV rays are reflected on said ohmic electrodes toward the wavelength converting element.

With a consequence, the UV rays to be wavelength converted by the wavelength converting element to the white light increase and the white light emission output correspondingly increases.

DESCRIPTION OF THE PREFERRED EMBODIMENT

Details of this invention will be more fully understood from the description of the preferred embodiment given hereunder in reference with the accompanying drawings.

Figure 1:
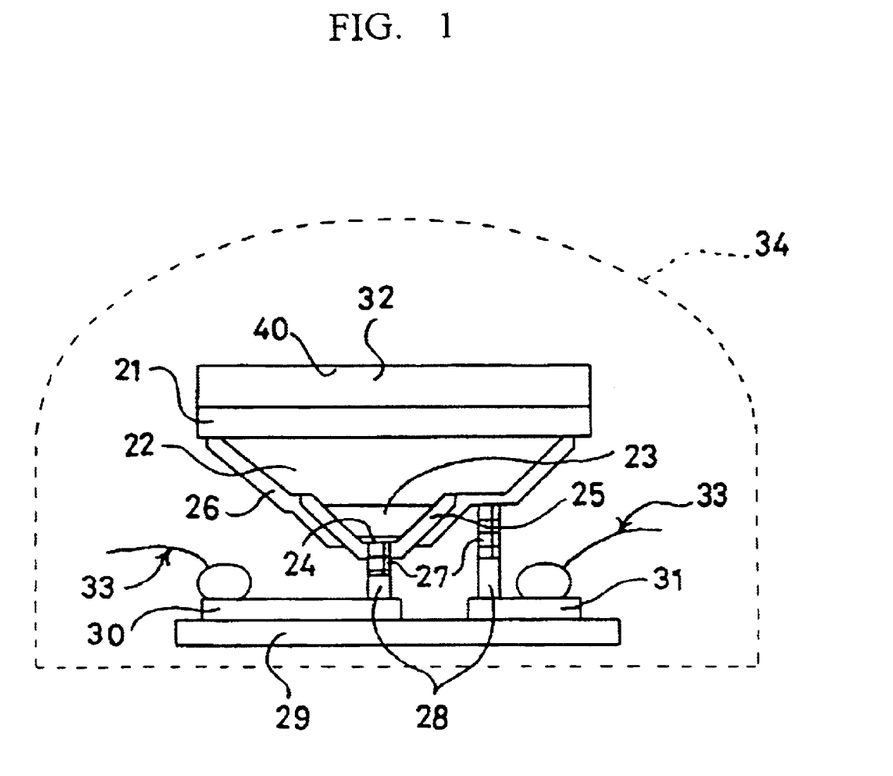
FIG. 1 is a sectional view showing a white light emission diode as one embodiment of this invention.

FIG. 1 is a schematic sectional view showing one embodiment of the white light emission diode according to this invention.

In FIG. 1, respective reference numerals designate: 21 . . . substrate; 22 . . . n-type semiconductor layer; 23 . . . p-type semiconductor layer; 24 . . . p-type ohmic electrode; 25 . . . insulating film; 26 . . . n-type ohmic electrode; 27 . . . bonding pad for mounting; 28 . . . eutectic electrodes; 29 . . . insulating substrate; 30 . . . anode trip electrode; 31 . . . cathode trip electrode; 32 . . . wavelength converting element; 33 . . . gold wire; and 34 . . . molded resin. "In addition, reference numeral 40 designates a surface between the substrate 21 and the wavelength converting element 32."

This white light emission diode is made in a manner as will be described. First, the n-type semiconductor layer 22 (n-type GaN or N-type ZnO) is formed on a surface of the substrate 21 such as sapphire substrate transmitting UV rays and then the p-type semiconductor layer 23 (p-type GaN or p-type ZnO) is formed on said n-type semiconductor layer 22 to obtain a device wafer.

It should be understood that the GaN semiconductor layer maybe formed by the film deposition process, typically by MOCVD (metalorganic chemical vapor deposition) and the ZnO semiconductor layer may be formed by the film deposition process such as laser ablation process or MBE (molecular beam epitaxy) process.

Concerning the n-type semiconductor layer 22 and the p-type semiconductor layer 23, an alternative arrangement is also possible that the p-type semiconductor layer 23 is formed on the substrate 21 by said film deposition process and then the n-type semiconductor layer 22 is formed on said p-type semiconductor layer 23.

The device wafer obtained in this manner is subjected to liquid crystal etching or vapor phase etching in order to expose the n-type semiconductor layer 22 and then the p-type semiconductor layer 23 is provided thereon with the p-type ohmic electrode 24 formed by the suitable metal such as Ni, Au, Pt or Rh.

This p-type ohmic electrode 24 is preferably made of material presenting a high reflectivity in the wavelength band of UV rays so that this p-type ohmic electrode 24 may cooperate with the bonding pad for mounting 27 to realize an electrode construction preventing UV rays from being emitted outward from the exciting element.

After the p-type ohmic electrode 24 has been formed, the insulating film 25 is formed using material presenting transparency in the wavelength band UV rays, for example, $Si_xN_y$, $SiO_2$, $Al_2O_3$.

Regarding this insulating film 25, the device wafer and the p-type ohmic electrode 24 may be formed together using process such as electron beam heating vapor deposition, sputtering or chemical vapor deposition process.

To obtain electrical contacts of the exciting element, the p-type ohmic electrode 24 and the n-type semiconductor layer 22 may be partially deprived of formation of the insulating film or the portions of the insulating film covering the electrical contacts may be removed after said electrode 24 and layer 22 have entirely coated with said insulating film.

The insulating film 25 in the embodiment is formed so that said insulating film 25 may cover the side surface of the p-type semiconductor layer 23 and cover also partially the side surface of the n-type semiconductor layer 22 in the vicinity of the interface between these layers 22, 23 along which these two layers 22, 23 are bonded together. In this way, an electric short-circuit can be effectively prevented.

Once the insulating film 25 has been formed, an entire side surface of the device wafer is covered with the n-type ohmic electrode 26 formed using material exhibiting a high reflectivity over the wavelength band of UV rays, for example, Ti, Ag, Al or the like.

After the p-type ohmic electrode 24 and the n-type ohmic electrode 26 have been formed, the bonding pad for mounting 27 is formed using metallic material such as Ti, Ni or Au and then the eutectic electrodes 28 are successively formed using, for example, Au—Su.

These bonding pad for mounting 27 and eutectic electrodes 28 may be formed together or separately, or these may be formed together with the p-type ohmic electrode 24 and the n-type ohmic electrode 26.

Generally, after formation of the p-type ohmic electrode 24 or the n-type ohmic electrode 26 or after formation of all the electrodes, these electrodes are heat treated in order to improve electrical and mechanical contact characteristics between the respective semiconductor layers and these electrodes.

After all the electrodes have been formed, the structure obtained in this manner is divided into individual LED chips (exciting elements) using dicing or scribing process and these individual LED chips are die bonded to respective sub-mount substrates.

More specifically, there is provided the sub-mount substrate comprising the insulating substrate 29 formed thereon with the anode trip electrode 30 and the cathode trip electrode 31 and then the LED chip is die bonded to this sub-mount substrate with the p-type semiconductor layer 23 lying on the side of said sub-mount substrate.

The sub-mount substrate having the LED chip die bonded thereon is mounted, in turn, on a LED frame or the like and then the electrodes 30, 31 are electrically connected to each other via the gold wire 33.

Thereafter, the wavelength converting element 32 comprising fluorescent material, multilayered optical film and a substrate holding said two points (glass, sapphire or the like, not shown) is mounted on the substrate 21.

The multilayered optical film constituting this wavelength converting element 32 reflects the UV rays as the excited rays not toward the molded resin 34 but toward the fluorescent material.

The molded resin 34 is formed by transparent epoxy resin so as to cover the LED chip and the sub-mount substrate.

With the white light emission diode constructed as has been described above, the exciting element emits the UV rays which are then wavelength converted by the wavelength converting element 32 to white light which is, in turn, irradiated through the molded resin 34.

According to the present embodiment as shown, the exciting element is shaped to have sloped side surface so that a relatively wide space may be available for the wavelength converting element 32 and a relatively narrow space may be available for the p-type ohmic electrode 24. The n-type ohmic electrode 26 may be provided on this sloped surface to ensure that the UV rays are reflected by this ohmic electrode 26 and do not enter the molded resin 34.

In addition, the n-type ohmic electrode 26 exhibits a sufficiently high reflectivity in the UV band to ensure that the UV rays reflected by this electrode 26 are reliably guided to the wavelength converting element 32.

Consequently, the UV rays to be wavelength converting element 32 increases and the white light to be output correspondingly increases.

The side surface of the exciting element sloped in the manner as has been described above facilitates the insulating film 25 to be formed and thereby improves reliability for electric insulation between the n-type semiconductor layer 22 and the p-type semiconductor layer 23. As a result, efficiency of the exciting element is correspondingly improved.

While the side surface of the exciting element may be sloped at an angle less than 90° with respect to the substrate 21 so far as it is desired to improve the efficiency of the exciting element, said side surface is preferably sloped at an angle in order to 45° with respect to the substrate 21 so that the UV rays reflected on the n-type ohmic electrode 26 may be reliably directed to the wavelength converting element 32.

Alternatively, it is also possible to form the n-type ohmic electrode 26 directly on the side surface of the p-type semiconductor layer 23.

It should be understood, in this alternative embodiment, that the n-type ohmic electrode 26 and the p-type ohmic electrode 24 must be electrically insulated from each other.

An arrangement is also possible that the side surface of the exciting element is covered with the p-type ohmic electrode 24.

In this case, it is required that the n-type ohmic electrode 26 should cooperate with the bonding pad for mounting 27 to form an electrode structure adapted to prevent the UV rays from being emitted outward and it is further required to provide the insulating film 25 on the side surface of the n-type semiconductor layer 22 inclusive of the bonded interface of said n-type semiconductor layer 22 and the p-type semiconductor layer 23.

Figure 2:
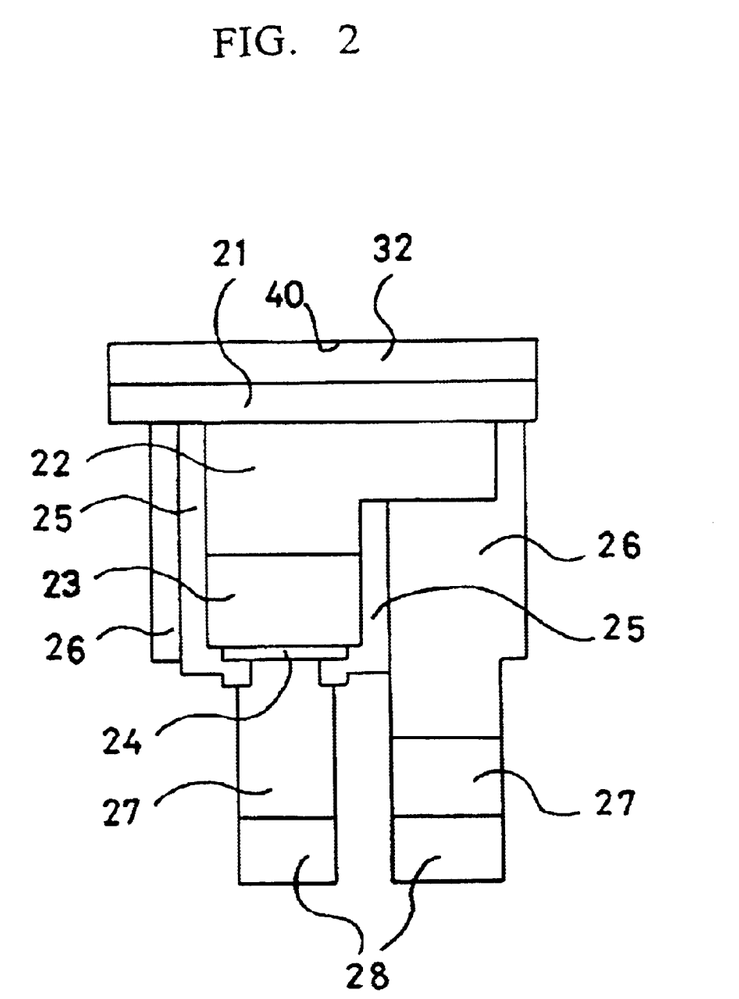
FIG. 2 is a sectional view showing a LED chip used in the white light emission diode according to this invention.

FIG. 2 is a sectional view showing another preferred embodiment of the white light emission diode.

The white light emission diode according to this embodiment is similar to the white light emission diode of FIG. 1 so far as the process of making it, so the members as well as the regions similar to those in FIG. 1 are designated by the similar reference numerals.

According to this; embodiment, the sapphire substrate 21 was formed on its surface with a GaN-based semiconductor layer functioning as the exciting element for emission of the UV rays using the MOCVD process and thereby the device wafer was constructed.

This device wafer has its p-type GaN layer and activated layer portion etched (to a depth of approximately 4000 Å from the surface) by a reactive ion etching (RIE) process using Cl-based gas in order to expose the n-type GaN layer.

The p-type ohmic electrode 24, the insulating film 25 and the n-type ohmic electrode 26 were formed by Ni (10 Å)/Rh (3000 Å), SiO$_2$ (4000 Å), Ti (250 Å)/A1 (15000 Å), respectively.

Then the device wafer was heat treated by rapid thermal annealing process using lamp heating.

Heating for this treatment was carried out at a temperature of 500° C. for 20 sec. in nitrogen atmosphere.

After this heat treatment, the bonding pad for mounting 27 (Ti (400 Å)/Au (10000 Å)) and the eutectic electrodes 28 (Au—Su) were successively formed.

All the electrodes as well as the insulating film were formed using the electron beam evaporating deposition process and patterning was carried out using the lift-off process.

The device wafer has its all electrodes formed was separated by the scribing process into individual LED chips each of which was die bonded to the sub-mount.

The wavelength converting element 32 was placed on the sapphire substrate 21 and this assembly was provided with the molded resin to obtain the white light emission diode.

Figure 3:
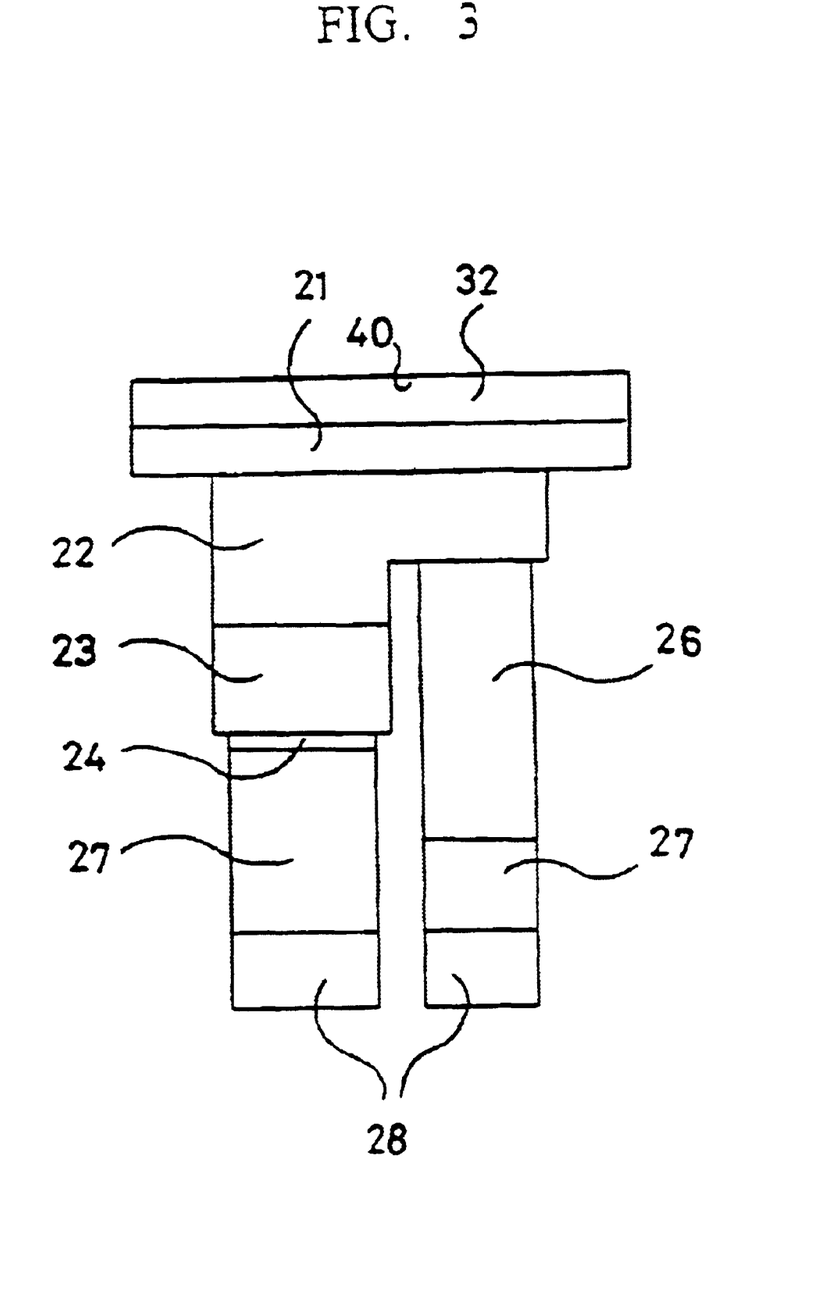
FIG. 3 is a sectional view showing a LED chip used in the white light emission diode of conventional type.

As a control for characteristic comparison, a white light emission diode (referred to hereinafter simply as the white light emission diode of prior art) was made in the same manner as has been described above using UV LED not provided with the reflective n-type ohmic electrode 26 on the side surface portion of the activated layer (i.e., the side surface portion of the device wafer lying in the vicinity of the interface along which the n-type semiconductor layer 22 and the p-type semiconductor layer 23 were bonded together).

FIG. 3 is a sectional view showing a LED chip used in the white light emission diode of prior art constructed in this manner.

Figure 4:
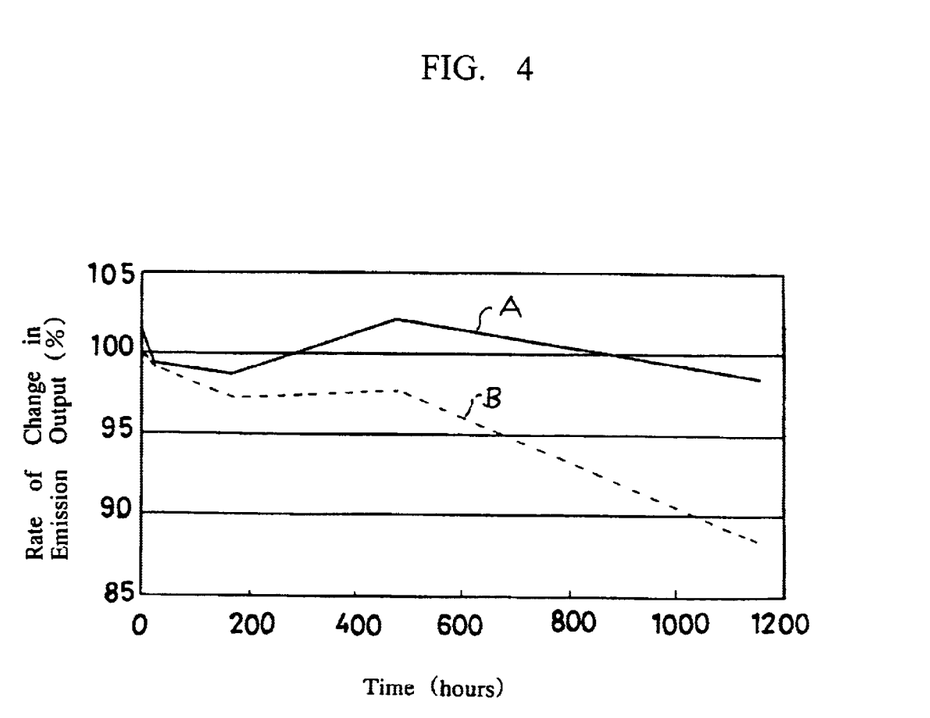
FIG. 4 is a graphic diagram showing light emission life characteristic of the white light emission diode according to this invention and the white light emission diode of conventional type.

FIG. 4 is a graphic diagram showing light emission life characteristic of the white light emission diode using the LED chip of FIG. 2 according to this invention and the white light emission diode of conventional type as shown in FIG. 3.

Referring to FIG. 4, a curve A represents a life characteristic exhibited by the white light emission diode according to this invention and a curve B represents a life characteristic exhibited by the white light emission diode of prior art.

The curve A indicates that a light emission output of the white light emission diode according to this invention as measured 1150 hours after the light emitting life test starting was determined to be approximately 98% of the light emission output as measured immediately after the light emitting life test starting.

On the other hand, the curve B indicates that a light emission output of the while light emission diode of prior art as measured 1150 hours after the light emission test starting was determined to be approximately 88% of the light emission output as measured immediately after the light emitting test starting.

This comparison demonstrates that the white light emission diode according to this invention improves the light emitting life characteristic by approximately 10% after the light emission diode has been continuously turned on for 1150 hours.

As will be apparent from the foregoing description, the white light emission diode according to this invention is characterized in that the exciting element provided with the wavelength converting element has its surface except on side covered with the ohmic electrode having a high reflectivity and thereby the UV rays emitted from the exciting element is prevented from entering the molded resin.

With such unique arrangement, the molded resin is not deteriorated as the time elapses and the white light wavelength converted by the wavelength converting element is effectively output through the molded resin. In this way, the white light emission diode exhibiting a high light emission life characteristic is obtained.

Furthermore, the side surface of the exciting element is sloped so that the UV rays reflected on the ohmic electrode may be reliably guided to the wavelength converting element and the UV rays emitted from the exciting element may be efficiently converted to the white light. In this way, light emitting output can be improved.

Moreover, this invention allows to make the white light emission diode using the fluorescent material excited by the UV rays similarly to the fluorescent material usually used in the domestic fluorescent lamp. With a consequence, the white light emission diode according to this invention can individually adjust the fluorescent material as light emission components of three primary colors, i.e., blue, green and red and thereby can provide a wide range of color tone.

What is claimed is:

1. A white light emission diode comprising:

an exciting element for emitting UV rays, the exciting element including a p-type semiconductor layer and an n-type semiconductor layer and defining a contact region between the p-type semiconductor layer and the n-type semiconductor layer;

a wavelength converting element for converting the UV rays emitted by the exciting element to white wavelength light rays by means of fluorescence, the wavelength converting element being disposed on a first surface of the exciting element extending in parallel to the contact region;

an insulating film formed on a side surface of the exciting element over an area where the contact region intersects the side surface, the insulating film being transparent in the UV wavelength band and a vicinity thereof;

a p-type ohmic electrode and an n-type ohmic electrode both having high reflectivity in the UV wavelength band and a vicinity thereof, the p-type ohmic electrode and the n-type ohmic electrode being disposed to cover at least a majority of the surface of the exciting element other than the first surface; and a transparent molded resin covering the exciting element, the wavelength converting element, the insulating film, the p-type ohmic electrode and the n-type ohmic electrode.

2. The white light emission diode of claim 1, wherein the side surface of the exciting element forms an angle of less than 90 degrees with the first surface.

3. The white light emission diode of claim 1, wherein the exciting element further includes a UV transmissive semiconductor substrate, one surface of the semiconductor substrate forming the first surface of the exciting element, another surface of the semiconductor substrate having the p-type semiconductor layer and the n-type semiconductor layer formed thereon, and wherein the wavelength converting element includes a substrate and an optical film.

4. The white light emission diode of claim 3, wherein the substrate of the wavelength converting element is formed of a material containing glass or sapphire, and wherein the optical film includes a fluorescent film.

5. The white light emission diode of claim 1, wherein the p-type ohmic electrode is formed of one or more metals selected from the group consisting of Ni, Au Pt and Rh, and the n-type ohmic electrode is formed of one or more metals selected from the group consisting of Ti, Ag and Al.

* * * * *